United States Patent [19]

Matsumiya

[11] 3,771,948

[45] Nov. 13, 1973

[54] HEATING DEVICES FOR MANUFACTURING SEMICONDUCTOR ELEMENTS

[75] Inventor: Ritsuo Matsumiya, Kasukabe, Japan

[73] Inventor: Nissho Semiconductor Co. Ltd., Yono-shi, Saitama-Ken, Japan

[22] Filed: Feb. 26, 1973

[21] Appl. No.: 335,839

[30] Foreign Application Priority Data

Feb. 29, 1972 Japan ................................ 47/20963

[52] U.S. Cl. .................... 432/122, 432/52, 432/239, 214/18, 148/1.5

[51] Int. Cl. ............................ F27b 9/00, F27b 9/14

[58] Field of Search .................... 432/122, 6, 11, 45, 432/52, 51, 241, 239; 148/1.5; 34/4, 39; 214/18.34, 31

[56] References Cited

UNITED STATES PATENTS

| | | | |
|---|---|---|---|
| 3,723,053 | 3/1973 | Myers et al. | 432/122 |
| 3,669,431 | 6/1972 | Lenss et al. | 432/52 |
| 3,719,291 | 3/1973 | Redan | 432/52 |
| 3,615,956 | 10/1971 | Irving | 148/1.5 |

*Primary Examiner*—John J. Camby
*Assistant Examiner*—Henry C. Yuen
*Attorney*—Solon B. Kemon et al.

[57] ABSTRACT

The heating device for manufacturing semiconductor elements comprises conveyor means for successively conveying a plurality of semiconductor wafers coated with films to be heated, such as photoresist films, and a heating chamber disposed in the path of travel of the conveyor means. Microwave energy is irradiated in the heating chamber to heat the films. A plurality of pins are associated with the conveyor means. Means are provided to protrude and retract the pins with respect to the conveyor means, rotate and reciprocate the pins in parallel with the direction of travel of the conveyor means for uniformly distributing the microwave energy on the semiconductor wafers.

4 Claims, 8 Drawing Figures

HEATING DEVICES FOR MANUFACTURING SEMICONDUCTOR ELEMENTS

BACKGROUND OF THE INVENTION

This invention relates to a heating device for manufacturing semiconductor elements, and more particularly to a heating device for drying coatings, for example photoresist films, which are applied on the surfaces of semiconductor wafers, for example.

In the manufacture of integrated circuits so called photoetching technique is used. Among the process steps are included a plurality of steps of drying photoresist films coated on the surfaces of semiconductor wafers. These drying steps include two steps which are performed before and after a light exposure, respectively, that is a first step wherein the photoresist film is dried before baking a pattern corresponding to an integrated circuit and second step wherein the photoresist film is dried after the pattern has been baked and fixed. Generally, the former step is called the pre-baking whereas the latter step the post baking.

Respective steps in the photoetching technique have an influence upon the resolution of a pattern of the integrated circuit so that in order to obtain high quality integrated circuit it is essential to uniformly dry all portions of the photoresist films. This is especially true in the post baking.

However, prior art heating devices utilized for this purpose are constructed such that a plurality of wafers are contained in a container so as to simultaneously heat them in a furnace. For this reason, respective wafers are not heated under the same condition so that even in a single wafer, the degree of drying of different portions of the photoresist film is not uniform. Moreover, as the semiconductor wafer generally takes the form of a thin circular disc, and since core should be taken not to damage the photoresist film applied on the surface of the wafer, handling thereof is extremely troublesome.

SUMMARY OF THE INVENTION

It is an object of this invention to provide an improved heating device utilized to manufacture semiconductor elements which can heat uniformly films to be heated, such as photoresist films, thus providing semiconductor elements of high qualities.

Another object of this invention is to provide an improved heating device for use in the manufacture of semiconductor wafers coated with photoresist films wherein the semiconductor wafers are arrested in a heating chamber, rotated and reciprocated thereby heating them uniformly by the microwave energy radiated in the heating chamber. Briefly stated, according to this invention these and other objects of the invention can be accomplished by providing a heating device comprising conveyor means for successively conveying a plurality of semiconductor wafers coated with films to be heated, a heating chamber disposed in the path of travel of the conveyor means, means for irradiating microwave energy upon the semiconductor wafers when they are contained in the heating chamber, a plurality of pins associated with the conveyor means for arresting the semiconductor wafers in the heating chamber for an interval necessary for heating the semiconductor wafer, means for protruding and retracting the pins with respect to the conveyor means, and means for rotating and reciprocating the pins in parallel with the direction of travel of the conveyor means.

BRIEF DESCRIPTION OF THE DRAWINGS

FIGS. 3A to 5B are diagrams showing the distributions of high frequency or microwave energy for a semiconductor wafer wherein FIG. 3A shows a condition in which the wafer is held stationary, FIG. 5A shows a condition in which the wafer is rotated and reciprocated and FIG. 5B is a graph showing the distribution of the high frequency energy along line 5B—5B in FIG. 5A.

DESCRIPTION OF THE PREFERRED EMBODIMENTS

Figure 1:
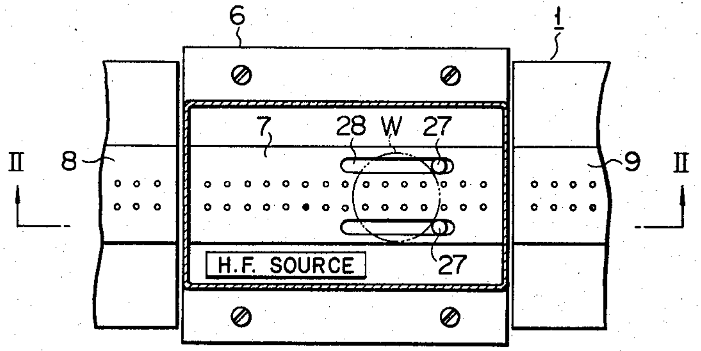
FIG. 1 is a cross-sectional view of one embodiment of the novel heating device.
Figure 2:
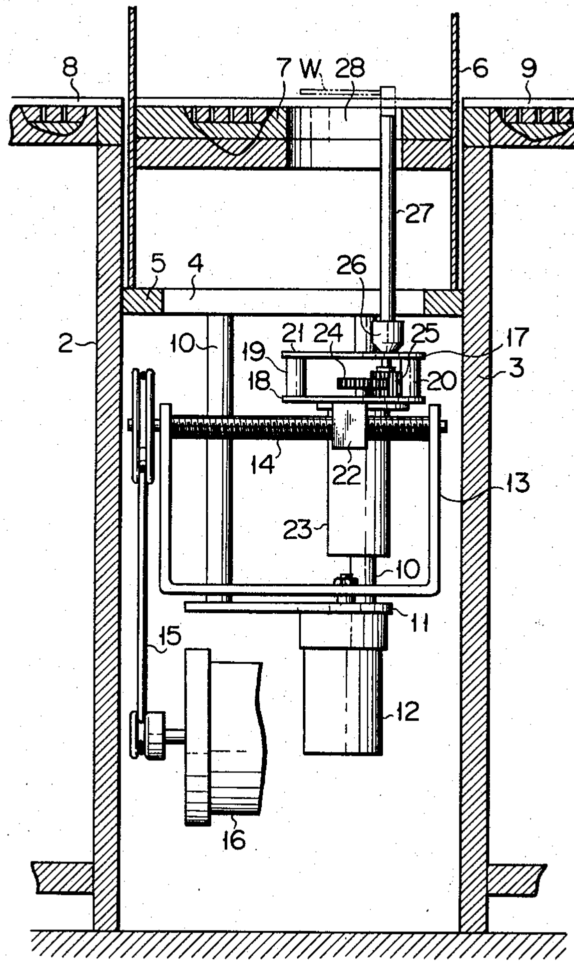
FIG. 2 is a longitudinal sectional view of the heating device taken along a line II—II in FIG. 1.

In a preferred embodiment shown in FIGS. 1 and 2, the heating device shown therein comprises a base 1 which is divided into a plurality of compartments by means of partition walls 2 and 3. Between partition walls 2 and 3 is provided a horizontal wall 5 having a vertical through hole 4 at its center to define a heating chamber 6 above the horizontal wall 5. Although a portion of the heating chamber 6 is not shown it is to be understood that the heating chamber takes the form of a box and that a high frequency or microwave generator, for supplying heating energy is disposed in the upper portion of the heating chamber. Of course, such high frequency generator may be located outside of the heating chamber 6 in which case the microwave is transmitted to the heating chamber 6 through a waveguide. A conveyor 7 for successively conveying semiconductor wafers is provided in the heating chamber on the same plane as the horizontal portion of base 1. Usually, as the conveyor is used an air bearing which utilizes the Cowander effect of an air stream.

Further, similar conveyors 8 and 9 are provided for the horizontal portion of the base 1. Although these conveyors 8 and 9 may also take the form of air bearings conveyors of the other type, such as belt conveyors can also be used.

A horizontal base 11 is supported by a plurality of supporting posts 10 suspended from horizontal wall 5, and a piston-cylinder assembly 12 is secured to the horizontal base 11 with the piston rod of the assembly connected to a U-shaped frame 13. A horizontal threaded shaft 14 is rotatably mounted on the upper end of frame 13. The shaft 14 is driven by an electric motor 16 through a motion transmission mechanism 15. A movable frame 21 comprising a pair of plates 17 and 18 interconnected by connecting rods 19 and 20 is provided with a downwardly extending projection 22 which is threaded to receive the threaded shaft 14. Thus, the movable frame 21 is moved in the horizontal direction by rotating the threaded shaft 14. Although not shown in the drawing, behind projection 22 is provided a similar projection adapted to slidably receive a shaft behind the threaded shaft 14 for the purpose of guiding the movement of the movable frame 21.

A motor 23 is mounted on movable frame 21 for driving a supporting member 26 through intermeshing gears 24 and 25. The supporting member 26 is provided with stops in the form of pins which are received in slots 28 provided for conveyor 7. In the example shown, two stops 27 are provided but it is possible to increase the number of the stops, if desired.

In operation, as semiconductor wafers W respectively coated with photoresist films are brought to heating chamber 6 by conveyor 8, the piston-cylinder assembly 12 is actuated to push upwardly the frame 13. As a result, movable frame 21 is also raised to cause stops or pins 27 to project above the upper surface of conveyor 7 to arrest the semiconductor wafers W. Since pins 27 are rotated by motor 23 through gears 24 and 25 the semiconductor wafers W are rotated because they make frictional engagement with end of pins 27.

At this time, motor 16 is started to move movable frame 21 through threaded shaft 14. Since the direction of rotation of motor 16 is periodically reversed, the movable frame 21 is reciprocated in the horizontal direction with the result that pins 27 are also reciprocated through slots 28. Thus, as the semiconductor wafers W are arrested, rotated and reciprocated by the pins 27, the photoresist films are dried uniformly by uniform irradiation of the microwave even when the distribution of the microwave radiated from the high frequency generator is not uniform dependent upon the position in the heating chamber 6.

Figure 3A:
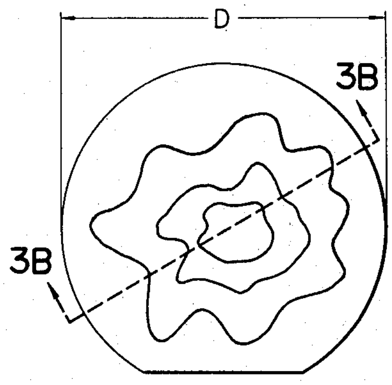
Figure 3B:
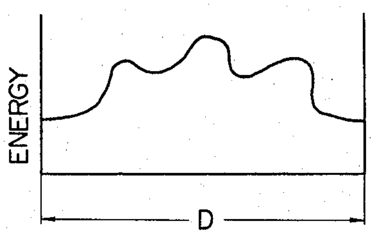
FIG. 3B is a graph showing the distribution of the high frequency energy along line 3B—3B in FIG. 3A.

The result of test made upon commercially available heat sensitive papers is as follows. Where a circular heat sensitive paper was bonded to a semiconductor wafer and the wafer was held stationary at a given position in the heating chamber 6 irregular fringes as shown in FIG. 3A were formed which shows that the intensity of the high frequency energy is high at the center but low at the periphery. This means that the distribution of the high frequency energy varies greatly dependent upon the position in the heating chamber. FIG. 3B is a graph showing the distribution of the high frequency energy along a line 3B—3B in FIG. 3A.

Figure 4A:
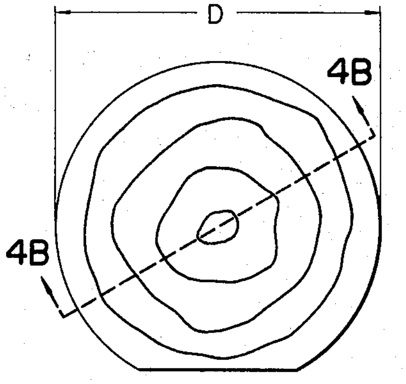
FIG. 4A shows a condition in which the wafer is rotated.

As the wafer is rotated, the irregularity of the fringes on the heat sensitive paper disappears thus producing a concentric distribution of small irregularity as shown in FIG. 4A. The distribution of the high frequency energy along line 4B—4B shown in FIG. 4A is shown in FIG. 4B.

Figure 4B:
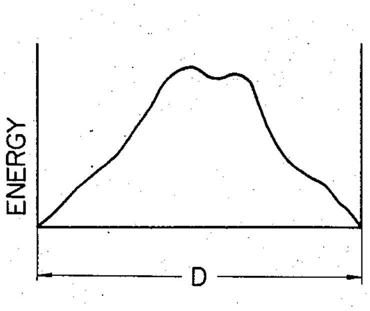
FIG. 4B is a graph showing the distribution of the high frequency energy along line 4B—4B in FIG. 4A.

By comparing FIGS. 3B and 4B it will be noted that the irregularity of the distribution curve is substantially reduced. However with the arrangements shown in FIGS. 3A and 4A, the drying of the photoresist film is not yet uniform whereby it is difficult to obtain semiconductor elements or integrated circuits of high qualities. This increases the number of rejects of the products. Such rejects can be readily detected by examining the products with a microscope after drying.

Figure 5A:
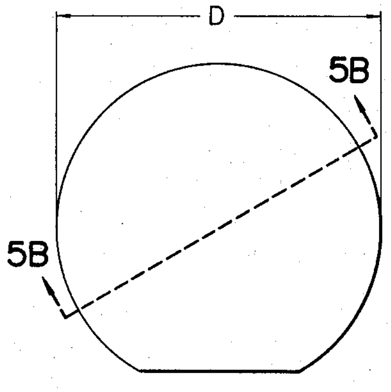
Figure 5B:
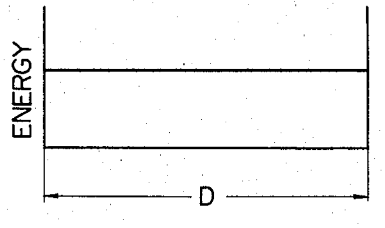

When the wafer is rotated and reciprocated, the color of the heat sensitive paper changes substantially uniformly as shown in FIG. 5A. Accordingly, the distribution of the high frequency energy on the heat sensitive paper becomes substantially uniform as shown in FIG. 5B.

When the photoresist films on the semiconductor wafers are dried under such condition, it is possible to assure products of uniform and high qualities thereby greatly reducing the number of rejects and hence the production cost.

After completion of the heating step, pins 27 are retracted from conveyor 7 and the wafers W are transferred to the next step.

As above described, the invention provides a new and improved heating device wherein the semiconductor wafer to be dried by the irradiation of high frequency energy is rotated and reciprocated, so that the high frequency energy is uniformly distributed whereby the film, such as a photoresist film applied on the wafer is dried uniformly thus providing semiconductor elements of uniform quality.

What is claimed is:

1. A heating device for manufacturing semiconductor elements comprising conveyor means for successively conveying a plurality of semiconductor wafers coated with films to be heated, a heating chamber disposed in the path of travel of said conveyor means, means for irradiating microwave energy upon said semiconductor wafers when they are contained in said heating chamber, a plurality of pins associated with said conveyor means for arresting said semiconductor wafers in said heating chamber for an interval necessary for heating said semiconductor wafers, means for protruding and retracting said pins with respect to said conveyor means, and means for rotating and reciprocating said pins in parallel with the direction of travel of said conveyor means.

2. The heating device as defined in claim 1 wherein said conveyor means is provided with slots extending in the direction of travel thereof, and said pins are rotated in and reciprocated along said slots.

3. The heating device as defined in claim 1 wherein said means for rotating and reciprocating said pins comprises a movable frame, means for rotatably mounting said pins upon said movable frame, an electric motor carried by said movable frame for rotating said pins, and means for reciprocating said movable frame in a direction parallel to said conveyor means.

4. The heating device as defined in claim 1 wherein said films to be heated are photoresist films coated on said semiconductor wafers.

* * * * *